US005653018A

United States Patent [19]

Anderau et al.

[11] Patent Number: 5,653,018

[45] Date of Patent: Aug. 5, 1997

[54] METHOD FOR THE MANUFACTURE OF AN ELECTRIC APPLIANCE

[75] Inventors: Felix Anderau, Muntelier; Bernard Bourqui, Courtepin, both of Switzerland

[73] Assignee: Saia AG, Murten, Switzerland

[21] Appl. No.: 456,930

[22] Filed: Jun. 1, 1995

[30] Foreign Application Priority Data

Jun. 1, 1994 [CH] Switzerland .......................... 01702/94

[51] Int. Cl.[6] ...................................................... H05K 3/34

[52] U.S. Cl. ............................. 29/840; 29/832; 361/786; 361/791; 439/59; 439/60

[58] Field of Search ........................ 29/832, 840; 439/59, 439/60; 361/785, 786, 791

[56] References Cited

U.S. PATENT DOCUMENTS

| | | | |
|---|---|---|---|
| 2,951,185 | 8/1960 | Buck | 439/59 X |
| 4,272,141 | 6/1981 | McKeen et al. | 439/59 |
| 4,472,764 | 9/1984 | Richard et al. . | |
| 4,838,798 | 6/1989 | Evans et al. | 439/61 |
| 4,985,870 | 1/1991 | Faraci | 439/60 X |
| 5,103,375 | 4/1992 | Cottingham et al. | 29/832 X |
| 5,136,468 | 8/1992 | Wong et al. | 439/59 X |
| 5,224,019 | 6/1993 | Wong et al. | 439/59 X |
| 5,265,322 | 11/1993 | Fisher et al. | 29/832 |
| 5,319,523 | 6/1994 | Ganthier et al. | 439/59 X |

FOREIGN PATENT DOCUMENTS

| | | |
|---|---|---|
| 0004507 | 10/1979 | European Pat. Off. . |
| 2168236 | 8/1973 | France . |
| 2522889 | 9/1983 | France . |
| 2532811 | 3/1984 | France . |
| 7922314 | 11/1979 | Germany . |

OTHER PUBLICATIONS

European Search Report corresponding to application No. CH 170294, dated Feb. 23, 1995, including English language translation.

*Primary Examiner*—Carl J. Arbes
*Attorney, Agent, or Firm*—Richard Linn

[57] ABSTRACT

The connection of the circuit board (7) of the appliance to connector blocks (10) is obtained by inserting and soldering holders (11) having connecting terminals (16) to the circuit board, connector blocks (10) being loosely attached to said connecting terminals (16). The mutual mechanical and electric connection is obtained by inserting the assembly into a case which secures the connector blocks to the circuit board, on one hand, and by fastening clamps which establish a connection of the connecting terminals (16) to connected conductors. The assembly of the appliance is particularly rational since the holders (11) with the connecting terminals are placed on the circuit board together with the remaining, non-represented components and are soldered thereto in common, the connector blocks (10) being simply slid on. The assembly is thus well suited for automation. The connector blocks abut to the edges of the circuit board (7), thus allowing a good space utilization and a compact construction.

20 Claims, 2 Drawing Sheets

METHOD FOR THE MANUFACTURE OF AN ELECTRIC APPLIANCE

BACKGROUND OF THE INVENTION

The present invention refers to a method for the manufacture of an electric appliance having a printed circuit board, and to an electric appliance manufactured accordingly. A method is known from DE-GM-79 22 314, where connecting pins which are held in conductor connecting boxes are soldered to the printed circuit or circuit board and connector blocks are subsequently attached to the conductor connecting boxes by snap means. The manufacture is complicated, difficult to automate, the forces acting upon the connected conductors are fully transmitted to the soldering connections, and the connector blocks are disposed on one side of the circuit board, so that an especially space-saving and compact construction is impossible.

Although it is known from FR-A-2,532,811 to solder connector blocks comprising connecting pins to the circuit board and to additionally secure them to a case part when they are built in, this solution has the same drawbacks as that according to DE-GM-79 22 314.

SUMMARY OF THE INVENTION

It is an object of the present invention to provide a simplified manufacturing method which is easy to automate and which allows a good space utilization, i.e. a compact construction. This object is attained by a manufacturing method wherein the circuit board is provided with components and connecting terminals and the components and connecting terminals are soldered thereto, whereupon the prepared connector block(s) is (are) loosely attached to the connecting terminals and then secured by inserting the circuit board in a portion of a case. Preferably, the connector blocks are loosely slid on laterally and in parallel to the plane of the circuit board and subsequently secured when the latter is inserted in the case. The connector blocks are preferably disposed asymmetrically with respect to the circuit board and project from the latter approximately to the height of the soldering connections on one side and approximately to the height of the components above the circuit board, whereby an optimal space utilization i.e. a compact, flat construction, is obtained.

BRIEF DESCRIPTION OF THE DRAWINGS

The invention will be explained in more detail hereinafter with reference to an embodiment and two alternative embodiments as represented in the drawings.

DETAILED DESCRIPTION OF THE PREFERRED EMBODIMENTS

Figure 1:
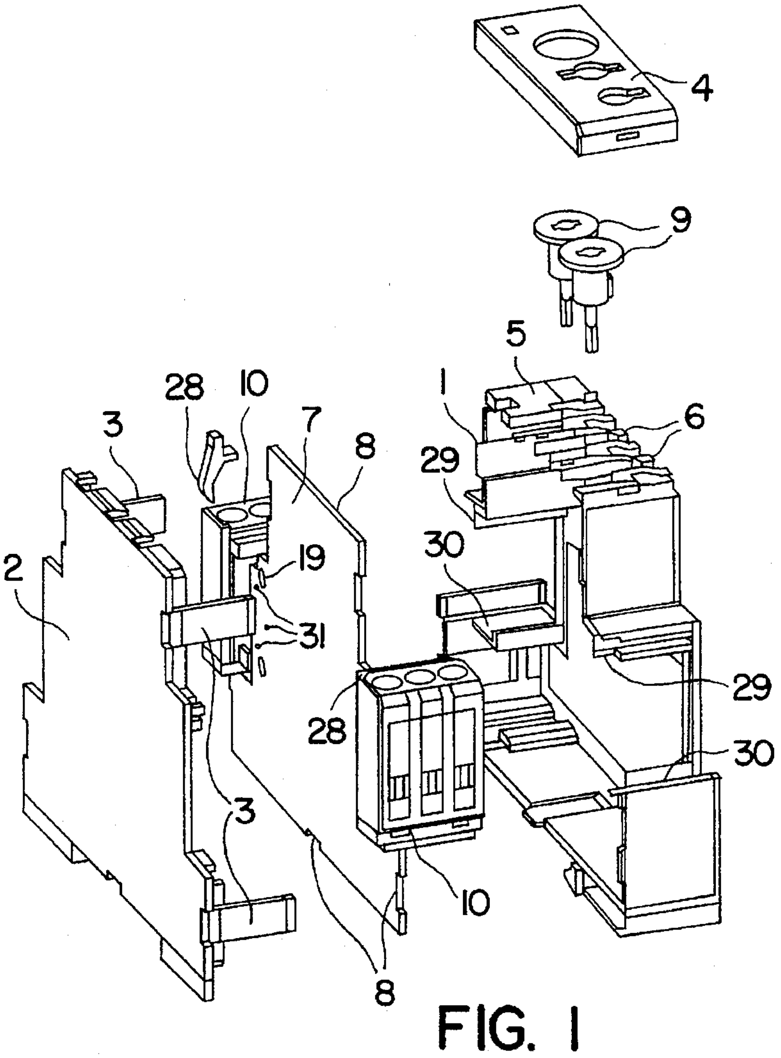
FIG. 1 shows a spatial view of the components of the appliance.
Figure 3:
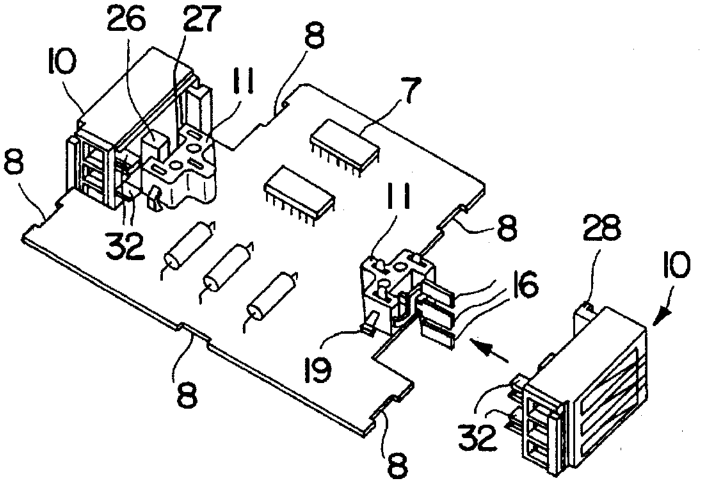
FIG. 3 shows a certain stage of the manufacturing process.
Figure 4:
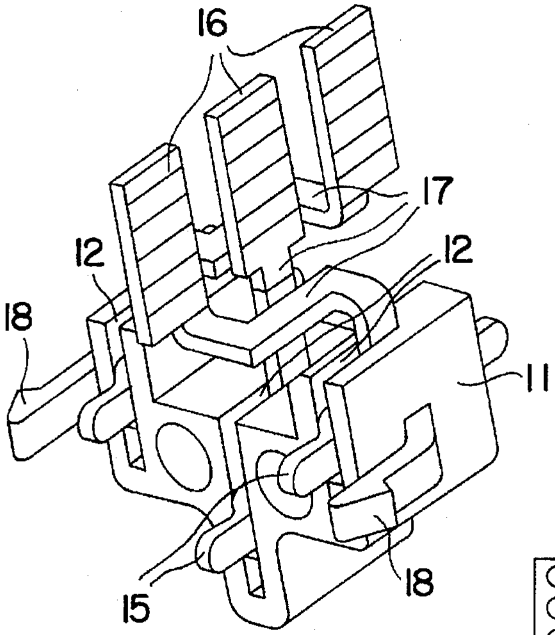
FIGS. 4 and 5 show a connector block with fastening lugs on an enlarged scale.
Figure 5:
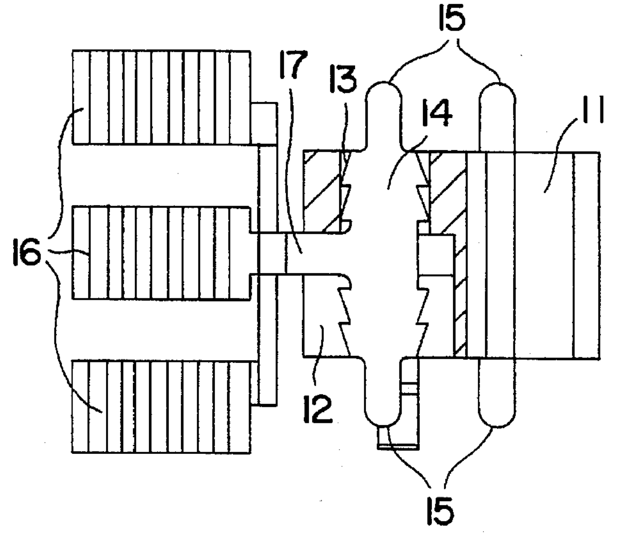

The case of the represented appliance comprises a shell-like base 1 having a bottom and side walls and to which a cover 2 is fastened by means of spring hooks 3. A front cover 4 may be attached to front wall 5 by snap means in order to partly cover openings 6 of said front wall. A printed circuit board 7 is inserted in the case of the appliance which is schematically represented in the drawing without its strip conductors but with some components mounted thereon (FIG. 3). The strip conductors are disposed on the upper side of circuit board 7 which is visible in FIG. 1. Its edges are provided with cutouts 8 which allow the passage of spring hooks 3. FIG. 1 shows coupling elements 9 which may be connected to adjustable components of circuit board 7 such as e.g. potentiometers, and which are actuated through openings of front cover 4. The appliance is further provided with connector blocks 10 which are electrically connected to circuit board 7 and secured in the case in a manner described below. Terminal lugs which are mounted in holders and serve to connect circuit board 7 to connector blocks 10 are disposed on the underside of the circuit board in FIG. 1 and are not visible; they are, however, in FIG. 3, and their details are shown in FIGS. 4 and 5. The holders 11 of a plastic material are provided with grooves 12 and openings 13 wherein toothed holding tabs 14 are inserted. The said holding tabs comprise soldering lugs 15 of corrugated connecting terminals 16 which project from holder 11 on both sides. The connections 17 between holding tabs 14 and connecting terminals 16 are so designed that the three connecting terminals 16 lie in a common plane. As shown in FIG. 3, said plane is perpendicular to the plane of circuit board 7 when connecting terminals 16 are mounted. Holders 11 are provided with lateral hooks 18 which pass through holes 19 of circuit board 7 and are thus capable of securing holders 11 to the circuit board for a purpose relating to the mounting of the appliance and explained herebelow.

Figure 2:
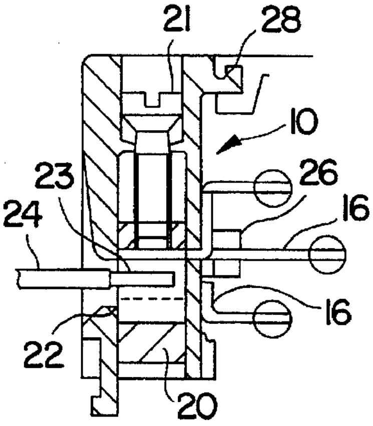
FIG. 2 shows a cross-section of a connector block.

FIG. 2 shows a longitudinal cross-section of a connector block 10. Each connector block 10 comprises three sockets for a respective clamp 20 which is displaceable by means of a terminal screw 21. A connecting terminal 16, on one hand, and the bared end 23 of a conductor 24, on the other hand, engage in the aperture of each clamp. By means of screw 21, clamp 20 is upwardly displaceable from the represented position in such a manner that wire end 23 will be solidly clamped to connecting terminal 16, whereby a reliable electric and mechanical connection of these parts is ensured. The connector block is provided with a collar 26 (FIGS. 2 and 3) receiving the central connecting terminal 16 and engaging in a groove 27 of holder 11 in the mounted condition (FIG. 3, left), thus contributing to longer creep paths between the three connecting terminals. The connector blocks are provided on one side with a hook 28 which engages behind a rib 29 when the appliance is assembled, while the other side of the connector block engages in a holding bracket of the case wall. The connector block 10 is thus secured on all sides when cover 2 is in place. Pairs of guiding lugs 32 serve the purpose of further fastening and guiding the connector block 10 when the latter is slid onto connecting terminals 16 of circuit board 7.

As mentioned in the introduction, the concept of the invention allows a particularly rational assembly of the appliance. The connector blocks, as well as the holders 11 with connecting terminals 16 inserted therein, are prepared according to FIGS. 2, 4 and 5. Components are then inserted into circuit board 7 in the usual manner, the two holders 11 with connecting terminals 16 also being placed on the circuit board like the other components and being secured thereon by means of hooks 18, and the soldering lugs 15 on one side thereof engaging in prepared holes 31 of the circuit board. The circuit board is then soldered in the soldering bath. The soldering lugs 15 of connecting terminals 16 are soldered to strip conductors like the other components of the circuit board.

The circuit board is now finished with the two holders including connecting terminals 16 and the other components. The two connector blocks 10 are now loosely pushed onto connecting terminals 16, as shown on the left of FIG. 3, collar 26 with its outwardly widened opening determines the position of the connector block while it is slid on and thus facilitates the assembly. When the two connector blocks 10 are loosely attached to the circuit board in this manner, they are inserted together with the latter in the base of case 1, the connector blocks now being positively secured in their positions by the case as well. If necessary, coupling elements are then inserted and front cover 4 is attached, and cover 2 is finally attached, whereby the assembly of the appliance is finished. This type of assembly is particularly adapted for automation.

However, a final check of the electric strength and of the function of the appliance may be effected before the cover is attached by inserting the circuit board in base 1 of the case with its soldering points facing up and thus fully accessible. The check of the tension resistance may be effected by means of the connecting clamps and the connecting terminals.

Figure 6:
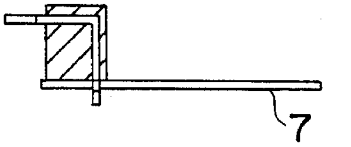
FIGS. 6 and 7 show a first alternative embodiment.
Figure 7:
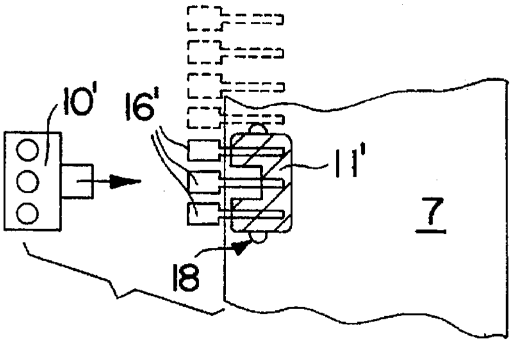

FIGS. 6 and 7 schematically show an alternative embodiment. In this case, circuit board 7 is provided with a holder 11' whose connecting terminals 16' lie in a common plane which is parallel to the plane of the circuit board. A suitably designed connector block 10' is attached to the connecting terminals and connected thereto. FIG. 7 indicates that more than three connecting terminals may be provided. Of course, less connecting terminals might be provided, or only one connector block and a number of connecting terminals might be provided.

Figure 8:
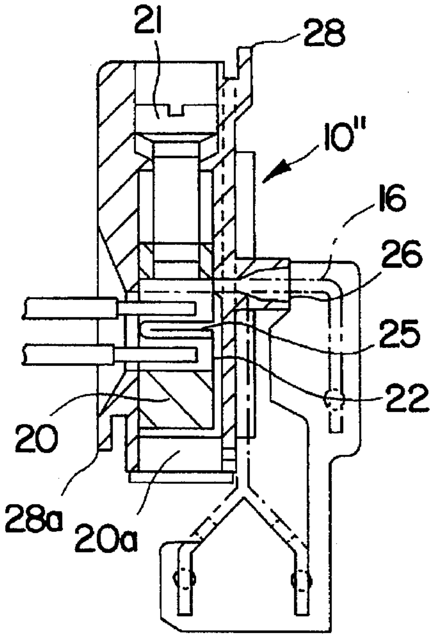
FIG. 8 shows a second alternative embodiment.

FIG. 8 shows a variant 10" of the connector block, corresponding parts being designated according to FIG. 2. The essential difference is that a U-shaped bow 25 is associated to each clamp 20, which surrounds the lower part of the clamp. In the represented open position, the lower shank of bow 25 is held between the clamp and a bottom **20*a* in such a manner that the upper shank of the bow is approximately in the center of aperture 22. Bared wires 23*a* and 23*b* of different diameters can now be inserted above and below said shank and safely clamped by fastening the clamp. The connector block is further provided with two hooks 28 and 28*a*** for a somewhat different attachment in the case.

Since holders 11 have soldering lugs 15 on the upper and the lower side, they may be soldered to two superposed circuit boards 7. The soldering lugs may also be surrounded by the injection-molded plastics material of the holders, whereby a better tension resistance is obtained.

We claim:

1. A method for the manufacture of an electrical device comprising the following steps:

- providing a circuit board;
- providing circuit elements in a circuit on said circuit board;
- providing terminals for said circuit which extend from at least one edge of said circuit board;
- providing at least one connector block having at least one connecting conductor mounted therein;
- providing a casing for accommodating said circuit board;
- sliding said at least one connector block onto said terminals whereby said connector block loosely holds said terminals; and
- placing said circuit board and said at least one connecter block, disposed on said terminals, in said casing.

2. A method as claimed in claim 1, wherein said terminals are disposed in a plane which is perpendicular to a plane in which said circuit board is disposed.

3. A method as claimed in claim 1, wherein said step of providing terminals further comprises the steps of:

- providing terminal holder means which hold said terminals;
- attaching said terminal holder means to said circuit board; and
- electrically connecting said terminals to said circuit.

4. A method as claimed in claim 3, wherein said step of electrically connecting is performed by soldering and wherein said terminal holder means are provided with soldering lugs.

5. A method as claimed in claim 1, wherein

- said step of providing a casing further comprises the step of providing a first and second casing portions; and
- said step of placing further comprises the step of placing said circuit board and said at least one connector block in said first casing portion.

6. A method as claimed in claim 5, further comprising the steps of testing said circuit on said circuit board after said circuit board and said at least one connector block are disposed in said first casing portion.

7. A method as claimed in claim 6, further comprising the step of applying said second casing portion to said first casing portion to close said casing.

8. A method as claimed in claim 1, wherein said step of sliding is performed by moving said at least one connector block within a plane of said circuit board.

9. A method as claimed in claim 1, wherein said step of placing is performed in a direction perpendicular to a plane in which said circuit board is disposed.

10. An electrical device manufactured according to the method of claim 1, comprising:

- a circuit board;
- circuit elements in a circuit on said circuit board;
- terminals for said circuit which extend from said at least one edge of said circuit board;
- at least one connector block having at least one connecting conductor mounted therein; and
- a casing for accommodating said circuit board;
- wherein said at least one connector block is slid onto said terminals whereby said connector block loosely holds said terminals; and
- further wherein said circuit board and said at least one connecter block, disposed on said terminals, are disposed in said casing.

11. A device as claimed in claim 10, wherein said terminals are disposed in a plane which is perpendicular to a plane in which said circuit board is disposed.

12. A device as claimed in claim 10, further comprising:

- terminal holder means which hold said terminals;
- wherein said terminal holder means are attached to said circuit board and said terminals are electrically connected to said circuit.

13. A device as claimed in claim 12, wherein said terminals are electrically connected to said circuit by soldering using soldering lugs provided in said terminal holder means.

14. A device as claimed in claim 10, wherein said casing comprises a first and second casing portions and said circuit board and said at least on connector block are disposed in said first casing portion.

15. A device as claimed in claim 14, wherein said second casing portion is disposed on said first casing portion to close said casing.

16. A device as claimed in claim 10, wherein said at least one connector block is slidable mounted on said terminals in a direction parallel with a direction in which said terminals extend from said at least one edge of said circuit board.

17. A device as claimed in claim 10, wherein circuit board is mountable in said casing in a direction perpendicular to a plane of said circuit board and said housing holds and supports said circuit board and said at least one connector block which is mounted on said terminals.

18. A device as claimed in claim 10, wherein said at least one connector block comprises a clamp for clamping at least one of said terminals in electrical connection with said at least one conducting connector.

19. A device as claimed in claim 10, wherein said at least one connector block comprises guiding lugs.

20. A device as claimed in claim 12, wherein said terminal holder means comprise lateral hooks for attaching said terminal holder means to said circuit board.

* * * * *